US008754403B2

(12) United States Patent
Chang et al.

(10) Patent No.: US 8,754,403 B2
(45) Date of Patent: Jun. 17, 2014

(54) EPITAXIAL SOURCE/DRAIN CONTACTS SELF-ALIGNED TO GATES FOR DEPOSITED FET CHANNELS

(75) Inventors: Josephine B. Chang, Mahopac, NY (US); Paul Chang, Mahopac, NY (US); Vijay Narayanan, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/565,342

(22) Filed: Aug. 2, 2012

(65) Prior Publication Data

US 2012/0292598 A1    Nov. 22, 2012

Related U.S. Application Data

(62) Division of application No. 12/817,733, filed on Jun. 17, 2010.

(51) Int. Cl.
*H01L 29/06* (2006.01)

(52) U.S. Cl.
USPC ......... 257/29; 257/E51.04; 977/742; 977/938

(58) Field of Classification Search
USPC ........ 977/742, 938; 257/E51.04, 29; 438/478
See application file for complete search history.

(56) References Cited

U.S. PATENT DOCUMENTS

| 5,166,771 A | 11/1992 | Godinho et al. |
| 7,534,675 B2 | 5/2009 | Bangsaruntip et al. |
| 7,598,516 B2 | 10/2009 | Avouris et al. |
| 2003/0178617 A1 | 9/2003 | Appenzeller et al. |
| 2005/0037582 A1 | 2/2005 | Dennard et al. |
| 2005/0142766 A1* | 6/2005 | Hareland et al. ............ 438/268 |
| 2007/0014151 A1* | 1/2007 | Zhang et al. ............ 365/185.01 |
| 2007/0267703 A1 | 11/2007 | Chong et al. |
| 2008/0258207 A1* | 10/2008 | Radosavljevic et al. ...... 257/327 |
| 2008/0293228 A1* | 11/2008 | Kalburge ..................... 438/586 |
| 2008/0296562 A1 | 12/2008 | Murduck et al. |
| 2008/0308831 A1* | 12/2008 | Bojarczuk et al. ............ 257/98 |
| 2009/0032804 A1 | 2/2009 | Kalburge |
| 2009/0236675 A1 | 9/2009 | Yang et al. |
| 2010/0029063 A1 | 2/2010 | Gambin et al. |
| 2010/0155696 A1* | 6/2010 | Duan et al. ..................... 257/14 |

FOREIGN PATENT DOCUMENTS

| WO | 03081687 A3 | 10/2003 |
| WO | 2010020579 A1 | 2/2010 |

OTHER PUBLICATIONS

A. Javey et al., "Self-Aligned 40 nm Channel Carbon Nanotube Field-Effect Transistors With Subthreshold Swings Down to 70mV/decade," Proceedings of SPIE, 2005, pp. 14-18, vol. 5732.

(Continued)

*Primary Examiner* — William F Kraig
*Assistant Examiner* — Khaja Ahmad
(74) *Attorney, Agent, or Firm* — Cantor Colburn LLP; Vazken Alexanian

(57) ABSTRACT

A method of forming a self-aligned device is provided and includes depositing carbon nanotubes (CNTs) onto a crystalline dielectric substrate, isolating a portion of the crystalline dielectric substrate encompassing a location of the CNTs, forming gate dielectric and gate electrode gate stacks on the CNTs while maintaining a structural integrity thereof and forming epitaxial source and drain regions in contact with portions of the CNTs on the crystalline dielectric substrate that are exposed from the gate dielectric and gate electrode gate stacks.

11 Claims, 6 Drawing Sheets

(56) References Cited

OTHER PUBLICATIONS

G.M. Cohen et al., "Nanowire metal-oxide-semiconductor field effect transistor with doped epitaxial contacts for source and drain," Applied Physics Letters, 2007, 3pgs, vol. 90, American Institute of Physics.

Q. Li et al., "Design, Fabrication and Characterization of High-Performance Silicon Nanowire Transistors," IEEE Explore, 2008, pp. 526-529, IEEE.

Z. Zhang, et al., "Self-Aligned Ballistic n-Type Single-Walled Carbon Nanotube Field-Effect Transistors with Adjustable Threshold Voltage", Nano Letters, 2008, vol. 8, No. 11, pp. 3696-3701, American Chemical Society.

Yu-Ming Lin, et al., "High-Performance Carbon Nanotube Field-Effect Transistor With Tunable Polarities", IEEE Transactions on Nanotechnology, vol. 4, No. 5, Sep. 2005, pp. 481-489.

A. Javey, et al., High Performance n-Type Carbon Nanotube Field-Effect Transistors With Chemically Doped Contacts, Nano Letters, vol. 5, No. 2, 2005, pp. 345-348.

Office Action dated Mar. 23, 2012 corresponding to U.S. Appl. No. 12/817,733, filed Jun. 17, 2010; 20 pages.

Written Opinion and International Search Report dated Dec. 1, 2011 for Application No. PCT/EP2011/057455; 9 pages.

\* cited by examiner

EPITAXIAL SOURCE/DRAIN CONTACTS SELF-ALIGNED TO GATES FOR DEPOSITED FET CHANNELS

CROSS-REFERENCE TO RELATED APPLICATION

The present application is a divisional application of and claims the benefit of priority to U.S. application Ser. No. 12/817,733, which was filed on Jun. 17, 2010. The entire contents of U.S. application Ser. No. 12/817,733 are incorporated herein by reference.

BACKGROUND

Aspects of the present invention are directed to epitaxial source/drain contacts that are self aligned to gates for carbon nanotube-based field effect transistors (CNTFETs).

Switching devices based on carbon nanotubes (CNTs) have enormous potential due to the high carrier mobility and good short channel effects stemming from the thin body of the CNT. For example, CNTFETs have been proposed as a potential post-silicon complementary-metal-oxide-semiconductor (CMOS) solution for dense logic applications. For this potential to be realized, a method for building CNTFETs at dense pitch is necessary. The high mobility of the ideal CNTFET enables width scaling and good short-channel effects of the ideal CNTFET enables gate length scaling. However, one of the many additional challenges a CNTFET-base technology must overcome is compatibility with the high layout density that traditional silicon CMOS technology currently supports. In particular, for high layout density layouts, the source/drain and gate contacts to the switching device built around each CNT must all be precisely positioned.

Gate pitch scaling requires a manufacturable device structure in which the source/drain is self-aligned to the gate. Such self-alignment eliminates the variability in parasitic resistance and capacitance caused by misalignment of the source/drain to the gate and it also eliminates the area penalty of having to include a margin for misalignment in the layout. In silicon CMOS, this precise positioning is enabled by using gate shadowing to define implanted junction profiles and by the self-aligned silicide process. For CNTFETs, these methods are often inapplicable.

CNTFETs with source-drain contacts that are self-aligned to the gate (SA CNTFET) have been demonstrated using directional evaporation, chemical doping and electrostatic doping. In each process, however, problems remain. For example, the process window for directional evaporation is too narrow for manufacturability, chemical doping of CNT source/drain contacts continues to be an active area of research but results remain irreproducible and inconsistent and electrostatic doping works relatively well but is not ideal because the back gate required for electrostatic doping requires additional layout area and introduces a large parasitic capacitance.

SUMMARY

In accordance with an aspect of the invention, a method of forming a self-aligned device is provided and includes depositing carbon nanotubes (CNTs) onto a crystalline dielectric substrate, isolating a portion of the crystalline dielectric substrate encompassing a location of the CNTs, forming gate dielectric and gate electrode gate stacks on the CNTs while maintaining a structural integrity thereof and forming epitaxial source and drain regions in contact with portions of the CNTs on the crystalline dielectric substrate that are exposed from the gate dielectric and gate electrode gate stacks.

In accordance with another aspect of the invention, a process of forming self-aligned epitaxial source/drain contacts is provided and includes depositing carbon nanotubes (CNTs) on a crystalline dielectric underlayer, masking off field regions by a hard mask, patterning a gate stack with a hardmask atop the CNTs, encapsulating the gate stack with spacers and epitaxially growing source/drain regions adjacent to the spacers to provide a self-aligned source/drain.

In accordance with an aspect of the invention, a self-aligned device is provided and includes a plurality of carbon nanotubes (CNTs) disposed on a crystalline dielectric substrate, a field mask disposed on the crystalline dielectric substrate as a rectangular planar enclosure of the CNTs, a plurality of insulated gate stacks formed on the CNTs with a structural integrity thereof maintained and epitaxial source and drain regions provided in contact with portions of the CNTs exposed by the insulated gate stacks.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are shown in the following detailed description taken in conjunction with the accompanying drawings in which:

DETAILED DESCRIPTION

The self-aligned epitaxial source/drain contact process disclosed herein provides a platform for building self-aligned devices from deposited nanostructures, such as carbon nanotubes or semiconducting nanowires. The nanostructures are assumed to have already been deposited on an insulating crystalline underlayer, such as lanthanum yttrium oxide (LaYO). Field regions are masked off by a hard mask, a gate stack with a hardmask is patterned atop the nanostructures and the gate stack is then encapsulated with a spacer. A non-insulating material such as silicon is then epitaxially grown in the source/drain regions to provide a self-aligned source/drain.

Figure 1:
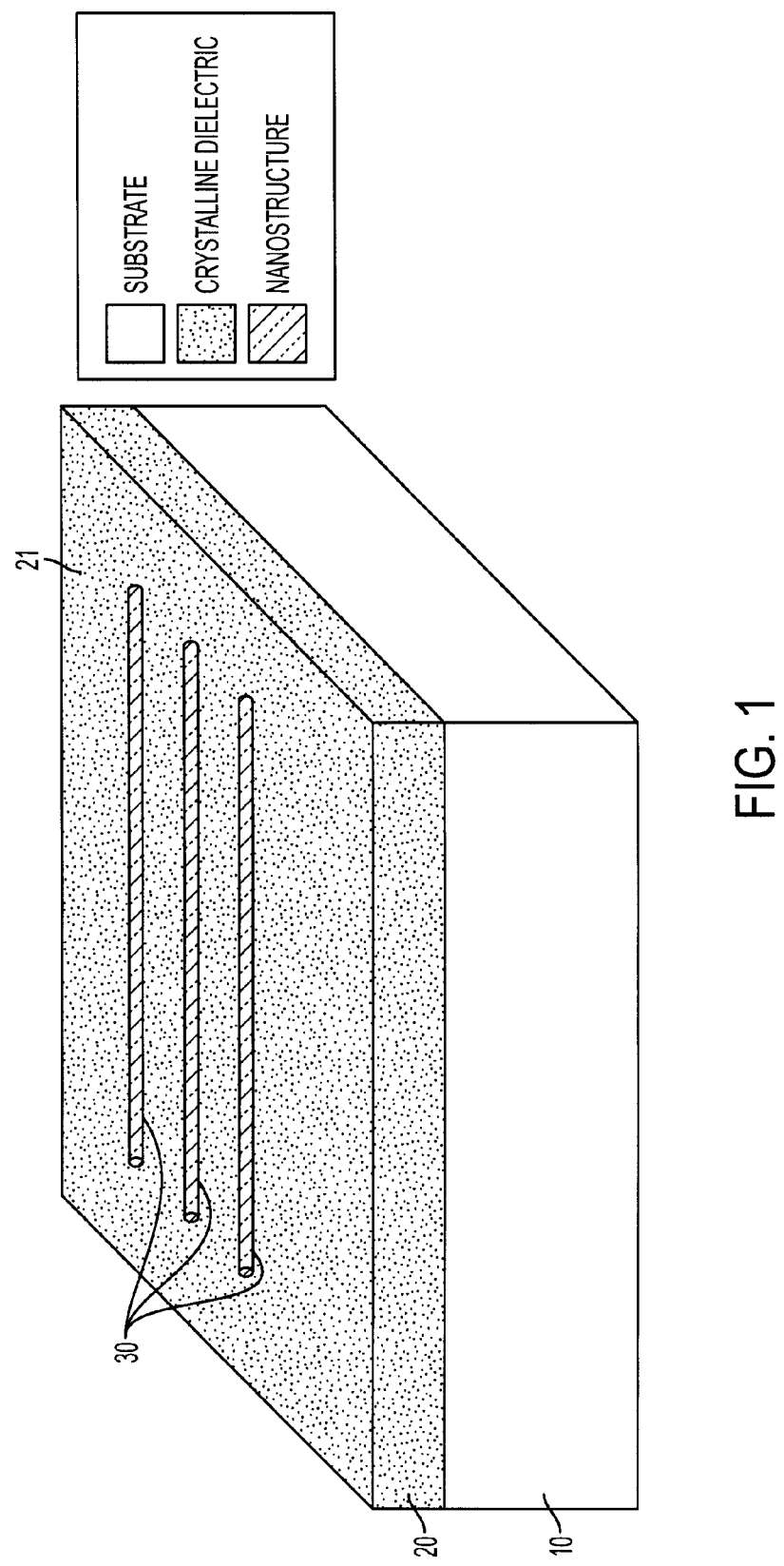
FIG. 1 illustrates a silicon substrate with a crystalline dielectric layer and deposited carbon nanotubes.

With reference to FIG. 1, a silicon substrate 10 is provided and has a top surface on which a layer of crystalline dielectric 20 is disposed. The crystalline dielectric 20 may include LaYO or some other similar crystalline dielectric on which silicon epitaxy can be seeded and epitaxial growth of silicon is possible. Here, the particular use of LaYO as the crystalline dielectric 20 enables the growth of silicon epitaxy due to the fact that a crystalline structure of silicon epitaxy has been found to be substantially similar to that of LaYO to an extent that the silicon epitaxial growth is possible even without the presence of a silicon or a silicon-germanium sub-structure.

A plurality of nanostructures, such as carbon nanotubes (CNTs) 30 or nanowires, are deposited on a surface 21, such as the top surface, of the crystalline dielectric 20. The CNTs 30 are deposited substantially in alignment with one another and substantially in parallel with one another, although this is not required. The CNT 30 deposition may be accomplished in accordance with various known methods and descriptions thereof are therefore omitted.

Figure 2:
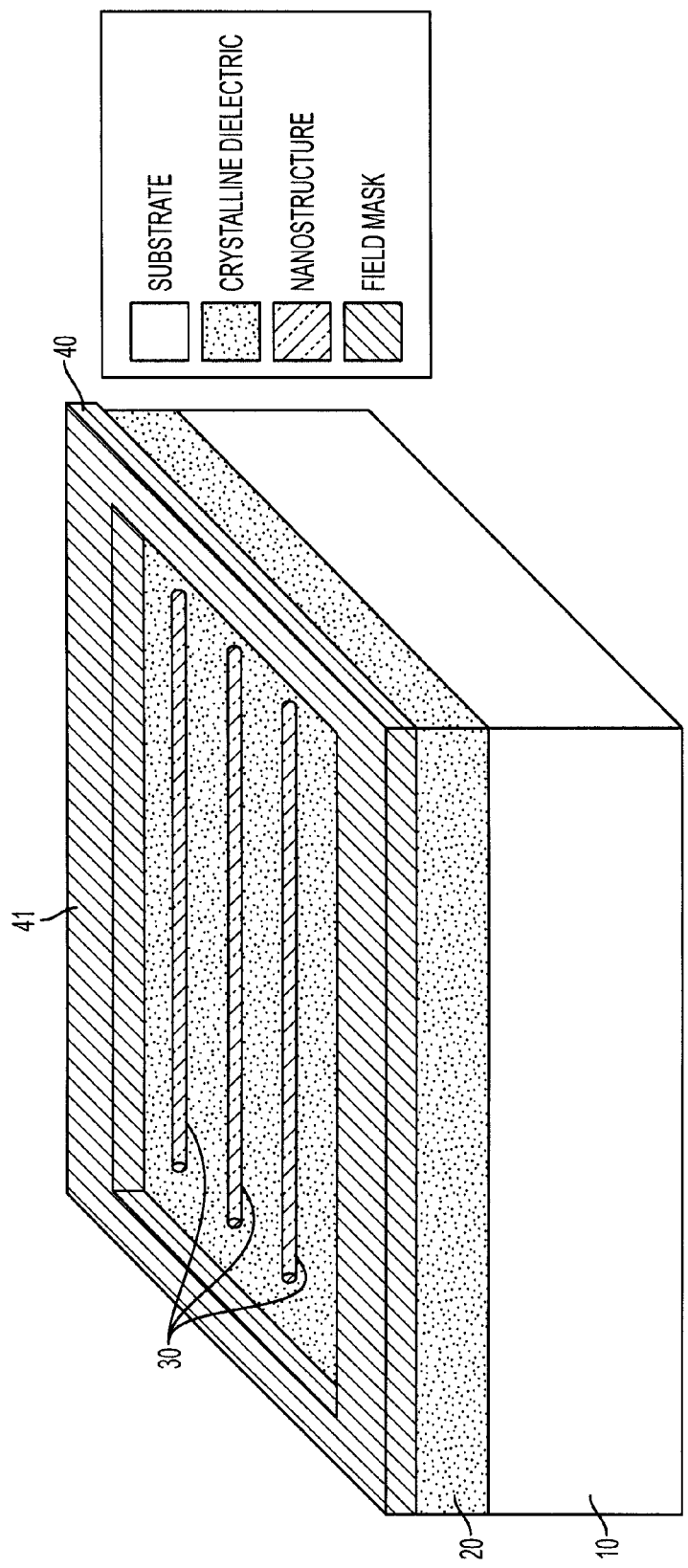
FIG. 2 illustrates a field mask formed around the carbon nanotubes.

Referring now to FIG. 2, in order to isolate a portion of the crystalline dielectric 20 encompassing a location of the CNTs 30, a field mask 40 including silicon dioxide ($SiO_2$) or some other similar material is placed on the crystalline dielectric 20 as a substantially rectangular planar enclosure of the CNTs 30. In this manner, the field mask may include edges 41 that form a perimeter around the CNTs 30. Of course, it is understood that the field mask 40 may be formed with various shapes and sizes as long as the CNTs 30 are isolated as necessary for a given application and that the rectangular shape shown in FIG. 2 is merely exemplary.

As an alternative to the use of a field mask 40, isolation of the portion of the crystalline dielectric 20 encompassing the location of the CNTs 30 may also be accomplished by etching the crystalline dielectric 20 around the CNTs 30 to form a groove. The exposed surfaces of the groove and/or the substrate 10 are then oxidized.

Figure 3:
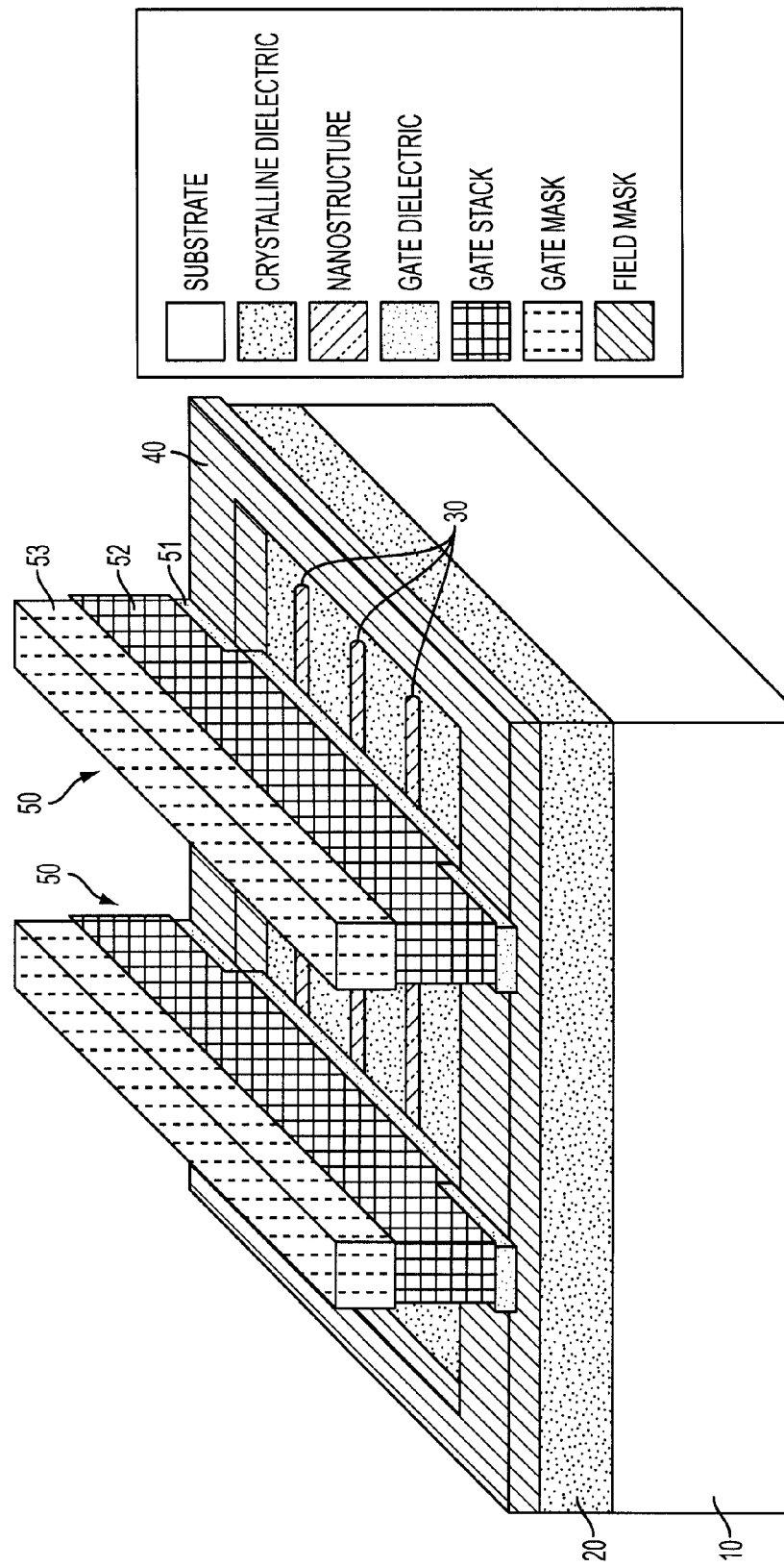
FIG. 3 illustrates gate stacks patterned onto the carbon nanotubes.
Figure 4:
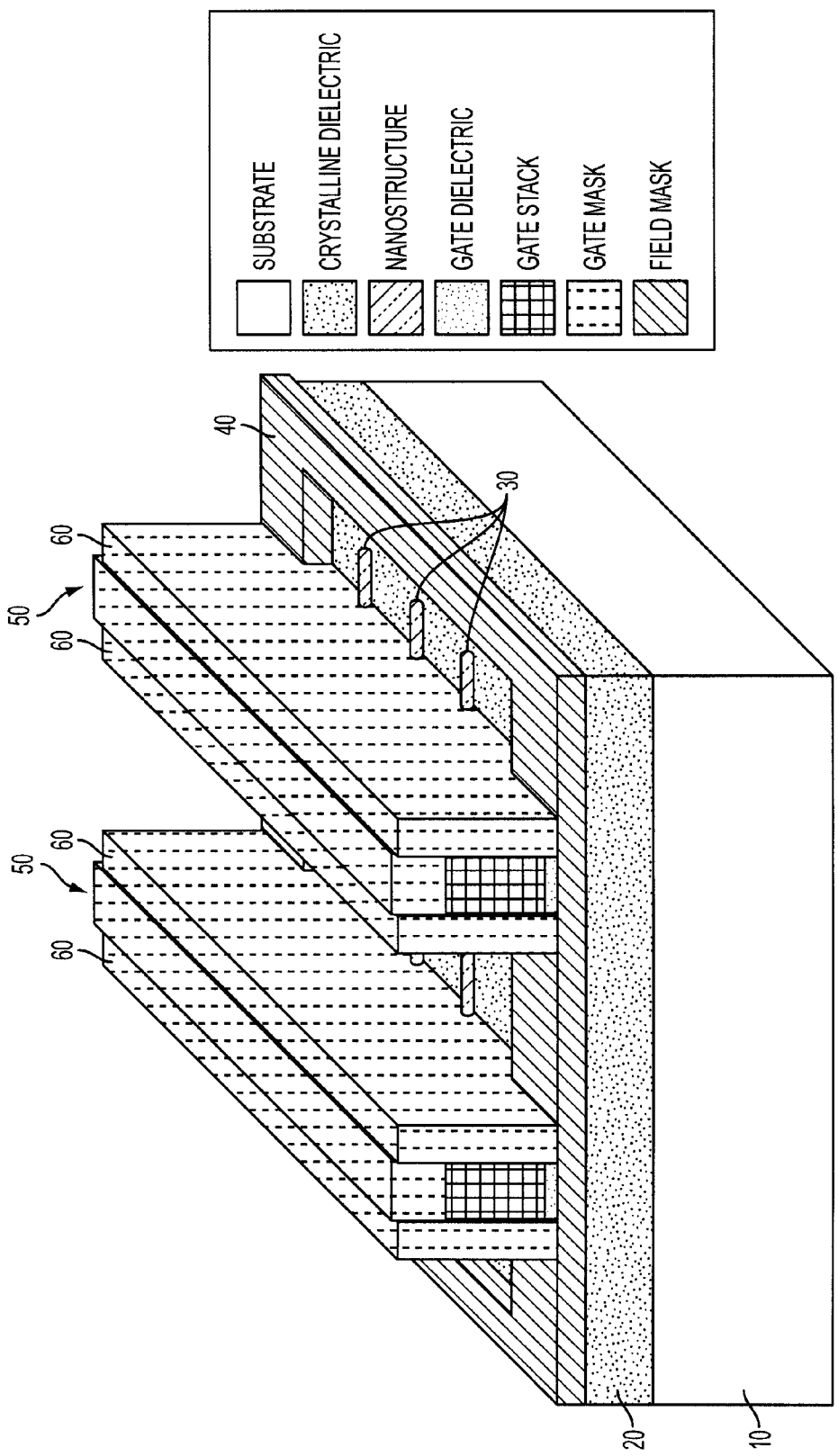
FIG. 4 illustrates insulation formed around the gate stacks.

With reference to FIGS. 3 and 4, gate dielectric and gate electrode gate stacks 50 are patterned onto the CNTs 30, the crystalline dielectric 20 and the field mask 40. The gate stacks 50 are substantially parallel with one another and substantially perpendicular with respect to an orientation of the CNTs 30, although this is not required. The gate stacks 50 may be formed of various materials in various arrangements, such as for example, a layer of a gate dielectric 51 (e.g., hafnium oxide, HfO2), a layer of gate stack material 52 (e.g., titanium nitride, TiN, or tungsten, W) and a secondary layer of gate mask material 53 (e.g., silicon nitride, SiN).

The patterning is accomplished without damaging the structural integrity of the CNTs 30. For example, the gate dielectric 51 may be deposited by way of atomic layer deposition (ALD) or spin-on deposition, in particular, which would not be expected to damage the CNTs 30. The gate stacks 50 are insulated by the secondary layer of the gate mask material 53. Gates are then defined using lithography and patterned using, for example, partial reactive ion etching (RIE) that is timed to end in close proximity to the CNTs 30. Some gate dielectric 51 may be left to protect the CNTs.

Spacers 60 are then formed along the sidewalls of the gates using a conformal deposition of spacer material followed by an anisotropic etch process that is performed so as to avoid damage to the CNTs 30. That is, the anisotropic etch of the spacers 60 is either end-pointed to stop once the remaining gate dielectric 51 is exposed or timed to end just prior to the time at which the CNTs 30 are about to be reached by the etchant (i.e., a plasma based etchant). In either case, once the etch process is stopped, it is followed by an isotropic wet etch that substantially completely removes all spacer 60 and gate dielectric 51 material from the source and drain regions 70.

As shown in FIG. 4, a result of this process is that the spacers 60, or the spacers 60 and the gate dielectric 51, will contact and substantially surround the CNTs 30 in an axial and a circumferential direction such that source and drain regions 70, which are described below, can be isolated from the gate stacks 50. In particular, the spacers 60, or the spacers 60 and the gate dielectric 51, contact the CNTs 30 along contact surfaces spanning the spacer 60 thicknesses and nearly the entire curved surfaces of the CNTs 30 (i.e., around the CNTs 30 for nearly 360°) without removing the CNTs 30 from contact with the crystalline dielectric 20.

Figure 5:
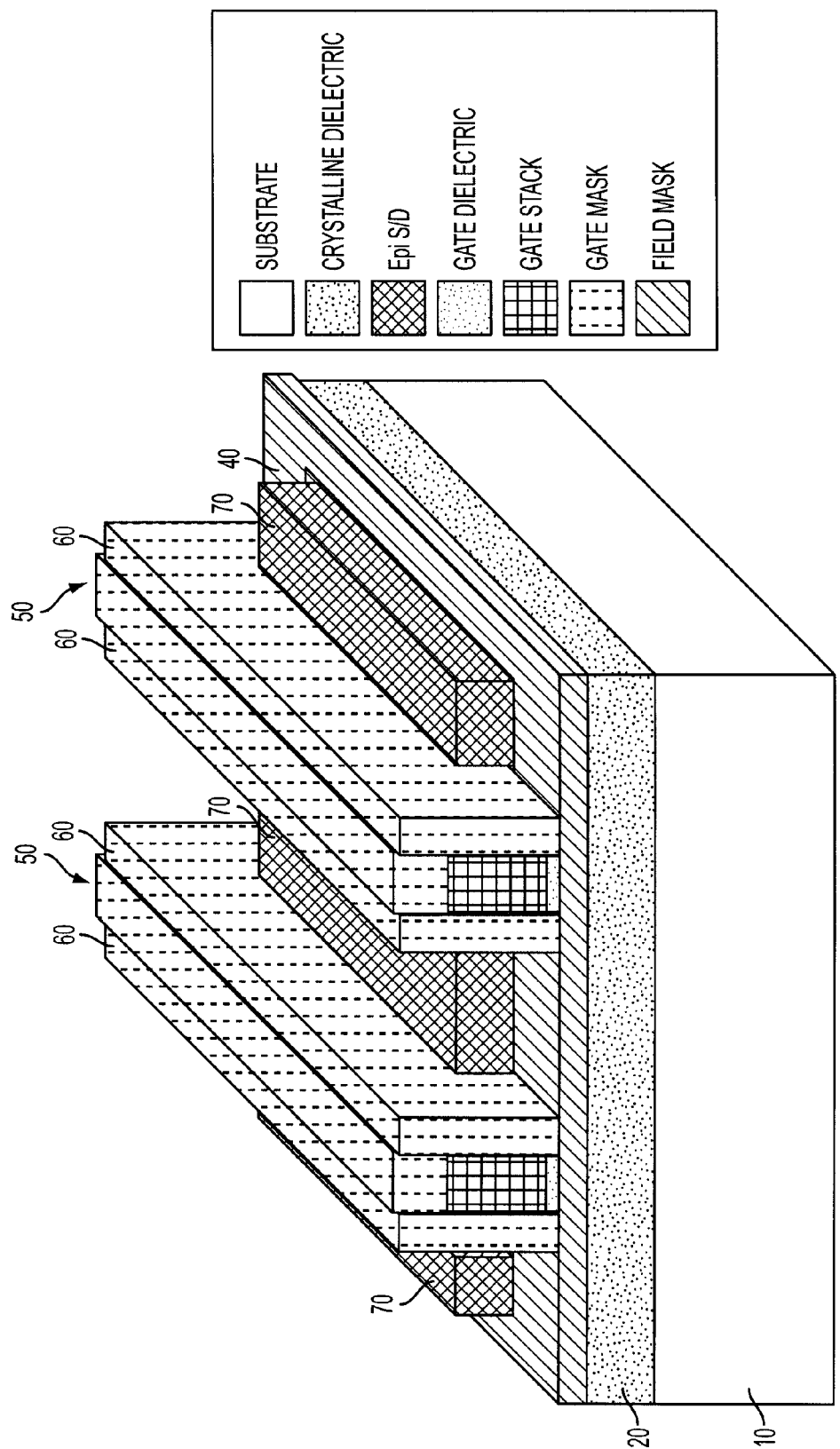
FIG. 5 illustrates epitaxial growth at source and drain regions.
Figure 6:
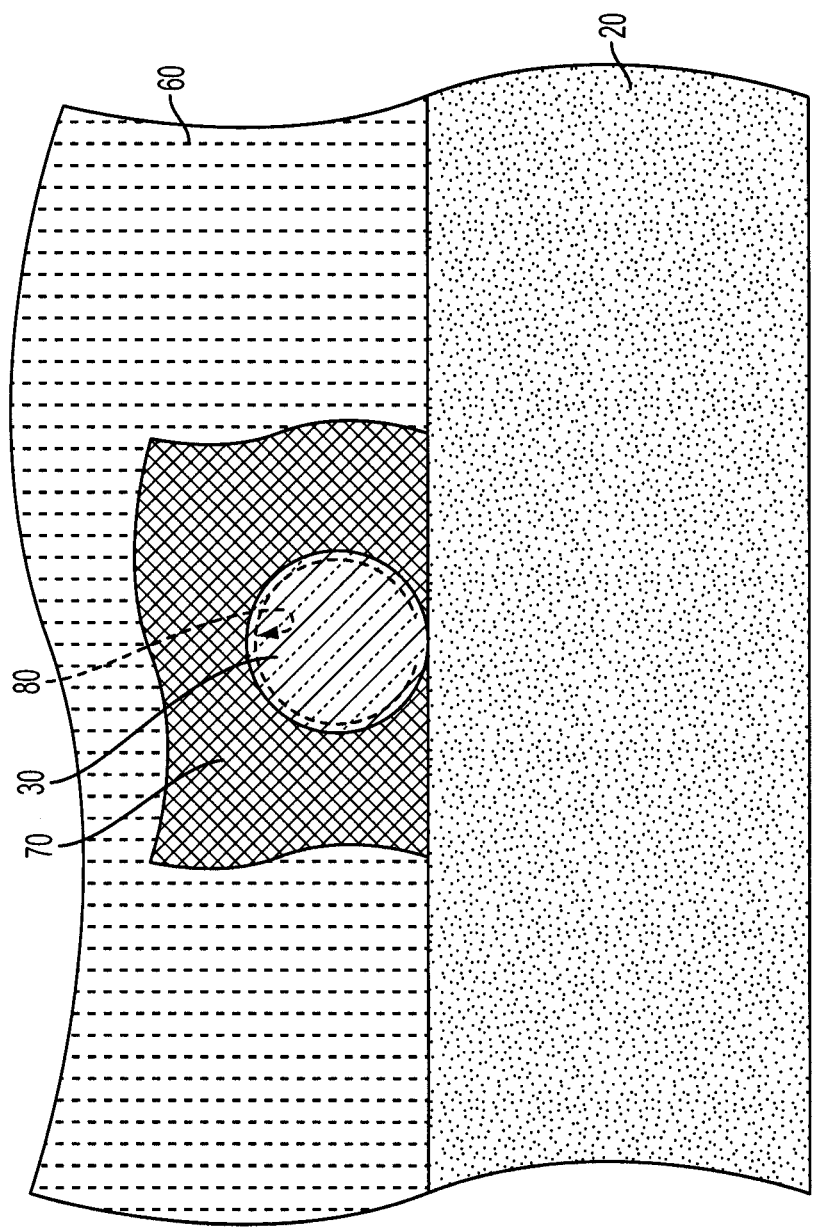
FIG. 6 shows a view of a carbon nanotube in contact with epitaxial source/drain material.

With reference to FIGS. 5 and 6, subsequent to the formation of the insulated gate stacks 50 and the spacers 60, source and drain regions 70 are epitaxially grown to be in contact with portions of the CNTs 30 exposed by the insulated gate stacks 50. As shown in FIG. 6, the contact between the epitaxial source and drain regions 70 with the CNTs 30 extends around nearly the entire circumference of the CNTs 30 with the result being formation of a reliable contact surface 80. Thus, as described above, the source and drain regions 70 contact the CNTs 30 along contact surfaces spanning the source and drain region 70 thicknesses and nearly the entire curved surfaces of the CNTs 30 (i.e., again, around the CNTs 30 for nearly 360°) without removing the CNTs 30 from contact with the crystalline dielectric 20.

As described above, the epitaxial growth of the source and drain regions 70 is facilitated by the presence of the crystalline dielectric 20, which seeds and subsequently permits epitaxial growth of silicon by virtue of its crystalline structure being similar to that of epitaxial silicon. The resulting epitaxial source/drain regions 70 are self aligned in that one-step lithography was employed for the definition of both the insulated gate regions.

The process of epitaxially growing the source and drain regions 70 may be accomplished in accordance with various known methods with full or partial silicidation completed later. For example, the source and drain regions 70 may be formed by the addition of boron or phosphorous doped silicon to the exposed CNTs 30 using in situ doped silicon epitaxy. Alternately, the source and drain regions 70 may be grown undoped and to be later implanted with ion species such as boron (B), arsenide (As) or phosphorous (P) followed by a rapid thermal annealing to activate the implanted dopants.

The epitaxial source drain regions may be converted to a metal silicide using a self-aligned silicide process, which is well known in the field of microelectronics.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:
1. A self-aligned device, comprising:
a plurality of carbon nanotubes (CNTs) disposed on a crystalline dielectric substrate;
a field mask disposed on the crystalline dielectric substrate as a rectangular planar enclosure of the CNTs without contacting the CNTs;
a plurality of insulated gate stacks formed on the CNTs and on uppermost surfaces of the crystalline dielectric substrate and on uppermost surfaces of the field mask with a structural integrity thereof maintained, wherein a gate electrode of the gate stacks extends onto the field mask; and
epitaxial source and drain regions provided in contact with portions of the CNTs exposed by the insulated gate stacks.

2. The self-aligned device according to claim 1, wherein the CNTs are disposed substantially in parallel with one another and the gate stacks are disposed substantially perpendicularly with respect to the CNTs.

3. The self-aligned device according to claim 1, wherein the crystalline dielectric substrate comprises lanthanum yttrium oxide (LaYO).

4. The self-aligned device according to claim 1, wherein the field mask comprises silicon dioxide ($SiO_2$).

5. The self-aligned device according to claim 1, wherein the gate stacks comprise a gate dielectric, a gate stack material and an insulating material.

6. The self-aligned device according to claim 5, wherein the gate dielectric comprises hafnium dioxide ($HfO_2$), the gate stack material comprises titanium nitride (TiN) or tungsten (W) and the insulating material comprises silicon nitride (SiN).

7. A self-aligned device, comprising:
   carbon nanotubes (CNTs) disposed on an uppermost surface of a crystalline dielectric substrate;
   a field mask disposed on and in contact with the uppermost surface of the crystalline dielectric substrate such that a lowermost portion of the field mask is coplanar with the CNTs for disposition as a planar enclosure of the CNTs, wherein the CNTs are not in contact with the field mask; insulated gate stacks formed on the CNTs, the uppermost surface of the crystalline dielectric substrate and an uppermost surface of the field mask with a structural integrity of the CNTs maintained such that portions of the CNTs are exposed by the insulated gate stacks, wherein a gate electrode of the gate stacks extends onto the field mask; and
   epitaxial source and drain regions provided in contact with the portions of the CNTs exposed by the insulated gate stacks.

8. The self-aligned device according to claim 7, wherein the CNTs are disposed substantially in parallel with one another and the gate stacks are disposed substantially perpendicularly with respect to the CNTs.

9. The self-aligned device according to claim 7, wherein the crystalline dielectric substrate comprises lanthanum yttrium oxide (LaYO).

10. The self-aligned device according to claim 7, wherein the field mask comprises silicon dioxide ($SiO_2$).

11. The self-aligned device according to claim 7, wherein the gate stacks comprise a gate dielectric, a gate stack material and an insulating material.

* * * * *